United States Patent [19]
Newell

[11] 3,937,556
[45] Feb. 10, 1976

[54] VIEWING FIELD SPLITTER
[75] Inventor: William H. Newell, Mount Vernon, N.Y.
[73] Assignee: The Perkin-Elmer Corporation, Norwalk, Conn.
[22] Filed: Sept. 26, 1974
[21] Appl. No.: 509,587

[52] U.S. Cl. ..................... 350/30; 350/35; 356/168
[51] Int. Cl.² .................... G02B 21/18; G01B 11/24
[58] Field of Search .................. 350/30, 33, 34, 35; 356/168, 172

[56] References Cited
UNITED STATES PATENTS
3,718,396  2/1973  Hennings ............................ 356/172
FOREIGN PATENTS OR APPLICATIONS
218,473  4/1969  U.S.S.R. ................................ 350/30

Primary Examiner—Alfred E. Smith
Assistant Examiner—Jon W. Henry
Attorney, Agent, or Firm—Sal A. Giarratana; Francis L. Masselle; John K. Conant

[57] ABSTRACT

A viewing field splitter particularly useful for simultaneously viewing two sides of an object for alignment purposes in which the two fields are obtained from microscopes mounted to pivot about the center of an arc which is illuminated. The microscope outputs are inputs to periscopes with one mirror from each periscope located on the axis of the pivot such that there is no rotation of the image and path lengths from each optical element to the point of combination of the fields are equal.

4 Claims, 2 Drawing Figures

VIEWING FIELD SPLITTER

BACKGROUND OF THE INVENTION

This invention relates to optical apparatus in general, and more particularly to an improved viewing field splitter for simultaneously viewing two sides of an object.

In copending application Ser. No. 339,860, filed Mar. 9, 1973 and assigned to the same assignee as the present invention, an optical projecting and scanning apparatus useful in producing integrated circuits is disclosed. The disclosed apparatus requires alignment between a mask and a semiconductor wafer. Alignment is carried out by an operator adjusting controls to affect relative motion between the wafer and mask. However, in order for the operator to properly carry out this alignment, he must be able to observe the results of the movement which he causes at the wafer. The aforementioned application discloses two viewing systems for making such alignment. One, a coarse viewing system, is the subject of an application Ser. No. 509,597, filed Sept. 26, 1974 by D. A. Markle, J. D. Buckley and R. E. Casas and assigned to the same assignee as the present invention. The second is a fine viewing system which permits simultaneously viewing two areas on the mask for fine alignment and which is disclosed and claimed herein.

SUMMARY OF THE INVENTION

The split field viewing apparatus of the present invention permits viewing two points on an object which is illuminated along an arc. In the aforementioned patent application Ser. No. 509,597, the illumination of the mask as imaged on the wafer, is in the form of an arc to permit a rotation of the mask to expose all portions thereof. Thus, during alignment, it is this arc of illumination which is present and points on that arc which must be aligned by the operator. Similar situations occur in other types of apparatus where fine alignment is necessary. To solve the problems of simultaneously observing two points on the wafer or other object illuminated along an arc, the present invention employs two microscopes mounted to pivot about the center of the arc. The two images from the microscopes are combined using periscopes each periscope having one mirror on the axis of the pivot such that there is no rotation of the image and such that the path length from each optical element to the point of combination of the fields are equal. The combined output is then viewed using conventional binocular viewing apparatus.

DETAILED DESCRIPTION OF THE PREFERRED EMBODIMENT

Figure 1:
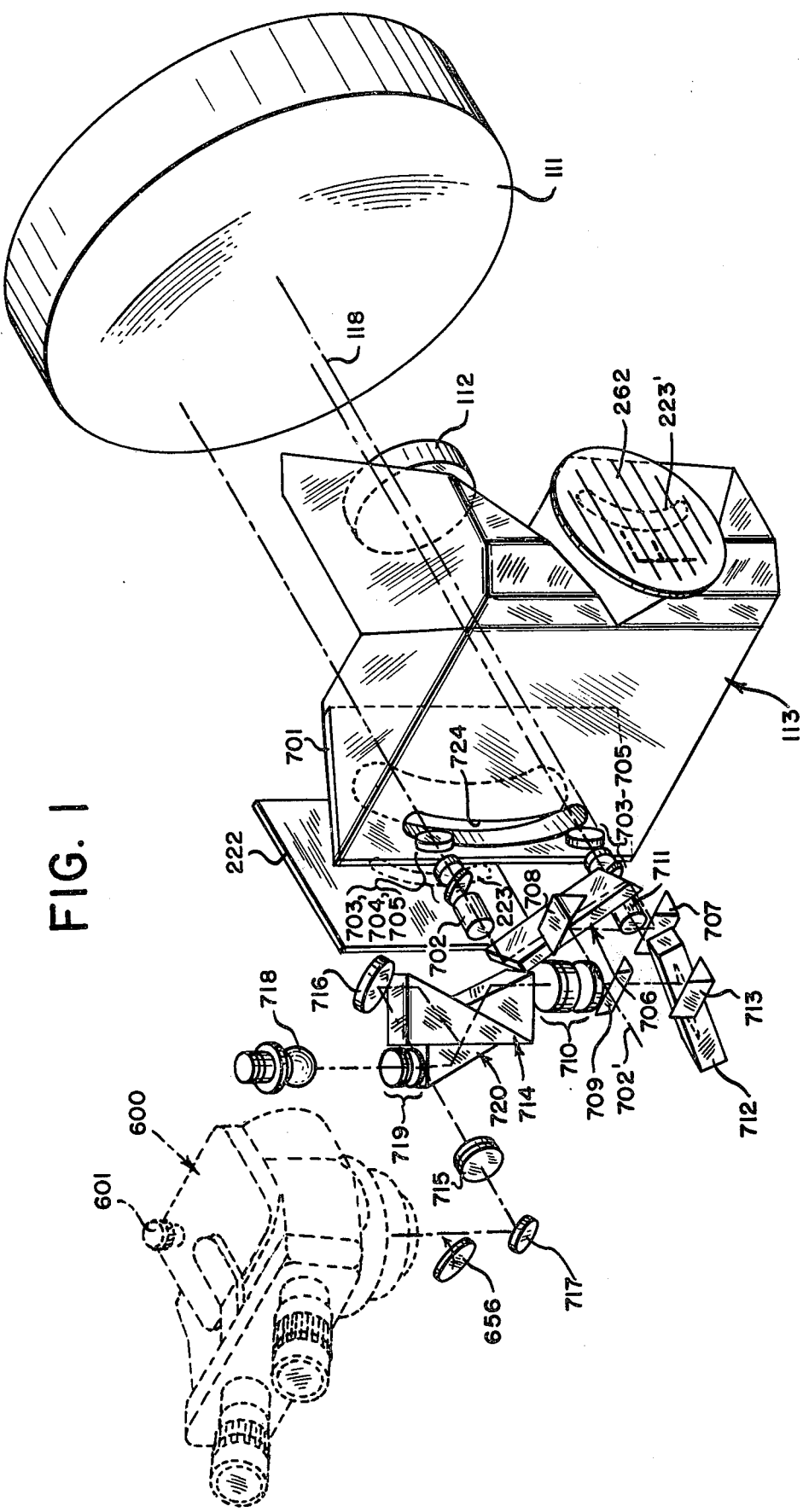
FIG. 1 is a perspective view of the split field viewing apparatus of the present invention, installed in an optical system for accurately positioning mask and wafer with respect to each other.

FIG. 1 illustrates the split viewing system of the present invention for use in an optical projection and scanning apparatus such as that disclosed in the aforementioned copending application Ser. No. 339,860. In FIG. 1, 222 is the mask which is being imaged on the wafer 262. The mask 222 has an illuminated area 223 generated by an illumination system more fully disclosed in the aforementioned application Ser. No. 509,597. The illuminated portion of the mask to be imaged on the wafer is reflected from the surface 114 to mirror 111 then to mirror 112 back to mirror 111 and then from the reflecting surfaces 116 and 117 to the wafer 262. Reflective surfaces 114, 116 and 117 are located on a mirror array 113 which, together with the optical system as a whole, is disclosed in the above mentioned copending application Ser. No. 339,860. For additional details of the optical system, reference also may be had to U.S. Pat. No. 3,748,015 issued July 24, 1973. The image of the mask at the wafer and the wafer itself considered as objects (and more particularly the portions of those objects lying within the area 223' on the wafer, which area is itself the image on the wafer of the illuminated area 223 on the mask), are reimaged backward successively at the reflecting faces 116, 117, mirror 111, mirror 112 and mirror 111 again. Selected portions of the resulting aerial image are examined with the aid of two movable microscope objectives, 702 and 711, in conjunction with an eyepiece 600. Instead, however, of examining such an aerial image in the plane of the mask itself, there is examined the aerial image formed by the fraction of the backwardly travelling light from the mirror 111 which passes through the plane reflector 701. More particularly, the two microscope objectives permit examination of two portions controllably spaced along the arcuate area 223' on the surface of the wafer away from the reader in FIG. 1.

For this purpose, the glass block 120 comprised by mirror array 113 has cut therethrough an arcuate slot 724, extending substantially parallel to the axis 118 from the near face of the block in FIG. 1 to the face of the block on which the plate 701 is affixed.

The aerial image of interest of the area 223' is arcuate in shape; its center of curvature is substantially on axis 118, it lies substantially in a plane perpendicular to that axis and is near the opening of aperture 724 at the near face of array 113 in FIG. 1.

Two microscope objectives 702 and 711 are provided, supported on arms (801 and 803 in FIG. 2) which are pivoted substantially on the axis 118 and of such length as to align those objectives with the arcuate slot 724. Supported with each objective 702, 711 are three plates 703, 704 and 705, suitably tilted about the axis of the objective to compensate for the aberrations introduced into the image presented to that objective by the convergent passage through the tilted plate 701 of light on its way to formation of that image.

Supported near the objective 702 on its arm is a periscope prism 706 to bring the axis of objective 702 down to the axis 118. After two reflections in prism 706 and two further reflections at stationary path folding mirrors 707 and 708, the image of the fraction of the object 223' at the wafer selected by objective 702 is formed in the vicinity of a beam splitting mirror 709. Mirror 709 selects half of this image and diverts it into one-half of the field of a field lens 710.

A second objective 711 with associated tilt-plates 703, 704 and 705, and a periscope prism 712 movably mounted on the second arm bring to the axis 118 light representative of another selected part of the area 223'. This light is deviated at a fixed mirror 713 into the other half of the field lens combination 710 through beam splitting mirror 709.

The objectives 702 and 711 thus each contribute an image of a semi-circular area along the arcuate object 223'. The two half fields so combined are presented to the operator in the eyepiece 600, after passage through an azimuthal-angleselecting prism 714, a relay lens 715, and deviation at mirrors 716 and 717. A lamp 718 and associated lens and filter combination 719 and combining prism 720 makes it possible to illuminate the semi-circular areas on the wafer, along the length of the area 223' in a visible color contrasting with that of the illumination system disclosed in connection with FIG. 5 of the aforementioned copending patent application Ser. No. 339,860.

Figure 2:
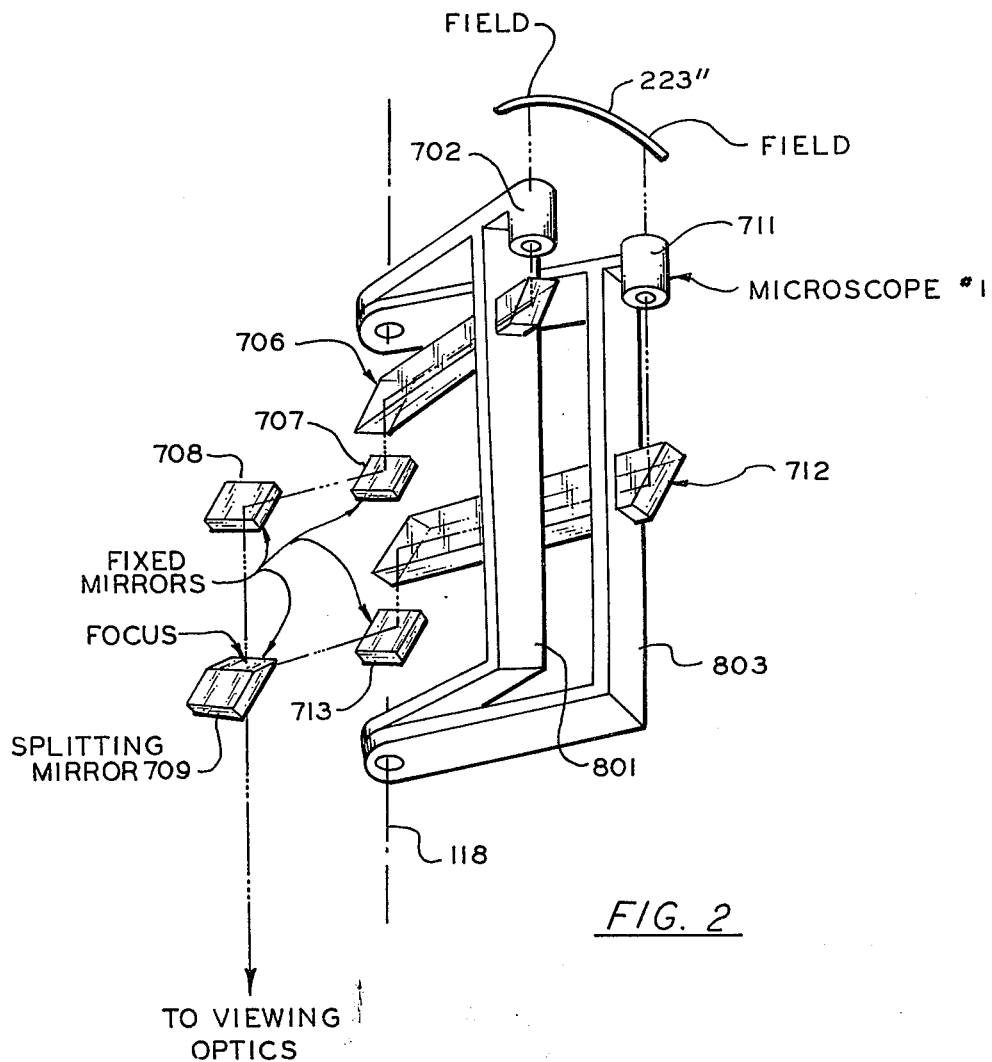
FIG. 2 is a perspective view showing the split field viewing apparatus of the present invention mounted to a pivot.

FIG. 2 illustrates the mounting of the microscopes and periscopes of the present invention on pivot arms. As illustrated, the microscope objective 702 views one end of the area image 223'' of the arcuate slit and the second microscope objective 711 the other end thereof. As illustrated, the microscope objectives 702 and 711 provide their outputs respectively to the periscope prisms 706 and 712. The microscope objective 702 is mounted along with the periscope 706 on a pivot arm 801. Similarly, the microscope objectives 711 and periscope prism 712 are mounted on a pivot arm 803. The pivot arms 801 and 803 pivot about the axis 118. Also illustrated is the manner in which the two periscopes 706 and 712 direct the respective images from the objectives 702 and 711 along the common axis 118. The image from the prism 706 directed along the axis 118 and is then reflected by the mirrors 707 and 708 to the beam splitting mirror 709. The image of the periscope 712 is reflected by the mirror 713 to the splitting mirror 709 as described above. As is evident from the figure, the path-length from each of the microscope objectives 702 and 711 to the beam splitting mirror 709 is equal. The pivot arms 801 and 803 are capable of adjusting separately or together and may be driven by conventional gear drives well known to those skilled in the art.

Thus, a viewing field splitter useful for alginment purposes has been shown. Although a specific embodiment has been illustrated and described, it will be obvious to those skilled in the art that various modifications may be made without departing from the spirit of the invention which is intended to be limited solely by the appended claims.

What's claimed is:

1. Apparatus for simultaneously viewing two points located on an illuminated circular arcuate area of an object comprising:
   a. first and second microscope objectives supported for viewing points on said arcuate area of the object
   b. first and second periscopes coupled respectively to each of said first and second objectives and supported in position to deflect the light from said points passed through said objectives along an axis through the center of curvature and perpendicular to the plane of said arcuate area,
   c. means mounting said objectives and periscopes for swinging each coupled objective, periscope pair independently of the other, about said axis while maintaining the periscopes in proper orientation to deflect said light along said axis, and
   d. means to present in a common eyepiece one-half the field of each of said objectives.

2. Apparatus according to claim 1 which includes an optical system for producing an image in said arcuate area of said object and an illuminating system for illuminating said arcuate area and in which an aerial image of said arcuate area reimaged backward through said optical system is viewed.

3. Apparatus according to claim 2 and further including means to compensate for aberrations interposed between each of said first and second microscope objectives and said aerial image.

4. Apparatus according to claim 1 wherein said means to present one-half of each field of each of said objectives comprises a beam splitting mirror.

* * * * *